(12) United States Patent
Sanocki et al.

(10) Patent No.: US 8,902,234 B1
(45) Date of Patent: Dec. 2, 2014

(54) SIMULATION PRIMITIVES

(75) Inventors: Tom J. Sanocki, Berkeley, CA (US);
Timothy Milliron, Oakland, CA (US)

(73) Assignee: Pixar, Emeryville, CA (US)

( * ) Notice: Subject to any disclaimer, the term of this patent is extended or adjusted under 35 U.S.C. 154(b) by 780 days.

(21) Appl. No.: 13/042,275

(22) Filed: Mar. 7, 2011

(51) Int. Cl.
*G06T 13/00* (2011.01)

(52) U.S. Cl.
USPC .......................................................... 345/473

(58) Field of Classification Search
CPC ....................................................... G06T 17/00
USPC .......................................................... 345/473
See application file for complete search history.

(56) References Cited

U.S. PATENT DOCUMENTS

| | | | |
|---|---|---|---|
| 2006/0170675 A1* | 8/2006 | Woo et al. | 345/419 |
| 2009/0144448 A1* | 6/2009 | Smith | 709/246 |
| 2011/0301732 A1* | 12/2011 | Gao | 700/96 |

* cited by examiner

*Primary Examiner* — Maurice L McDowell, Jr.
*Assistant Examiner* — Kyle Zhai
(74) *Attorney, Agent, or Firm* — Kilpatrick Townsend & Stockton LLP

(57) ABSTRACT

In various embodiments, information defining a first set of simulation primitives and a second set of simulation primitives is received at one or more computer systems. A first simulator and a second simulator are provided, using one or more processors associated with the one or more computer systems. The first simulator is based on the first set of simulation primitives and produces a first simulation. The second simulator is based on the second set of simulation primitives and produces a second simulation. A data structure is generated, using the one or more processors associated with the one or more computer systems, wherein the data structure represents dependencies between the first simulation and the second simulation.

22 Claims, 4 Drawing Sheets

SIMULATION PRIMITIVES

BACKGROUND

This disclosure relates to computer-generated imagery (CGI) and computer-aided animation. More specifically, this disclosure relates to a system and methods for creating and editing simulations based on universal primitives and simulation automation techniques for use in CGI and computer-aided animation.

With the wide-spread availability of computers, computer graphics artists and animators can rely upon computers to assist in production process for creating animations and computer-generated imagery (CGI). This may include using computers to have physical models be represented by virtual models in computer memory. Typically, two-dimensional (2D) or three-dimensional (3D) computer-aided animation combines 2D/3D models of objects and programmed movement of one or more of the models. In 3D computer animation, the first step is typically the object modeling process. Objects can be sculpted much like real clay or plaster, working from general forms to specific details, for example, with various sculpting tools. Models may then be constructed, for example, out of geometrical vertices, faces, and edges in a 3D coordinate system to represent the objects. These virtual models can then be manipulated using computers to, for example, simulate physics, design aesthetic actions such as poses or other deformations, crate lighting, coloring and paint, or the like, of characters or other elements of a computer animation display.

Pixar is one of the pioneering companies in the computer-generated imagery (CGI) and computer-aided animation industry. Pixar is more widely known as Pixar Animation Studios, the creators of animated features such as "Toy Story" (1995) and "Toy Story 2" (1999), "A Bug's Life" (1998), "Monsters, Inc." (2001), "Finding Nemo" (2003), "The Incredibles" (2004), "Cars" (2006), "Ratatouille" (2007), and others. In addition to creating animated features, Pixar develops computing platforms and tools specially designed for computer-aided animation and CGI. One such example is now known as PhotoRealistic RenderMan, or PRMan for short. PRMan is a photorealistic RenderMan-compliant rendering software system based on the RenderMan Interface Specification (RISpec) which is Pixar's technical specification for a standard communications protocol (or interface) between 3D computer graphics programs and rendering programs. PRMan is produced by Pixar and used to render their in-house 3D animated movie productions. It is also available as a commercial product licensed to third parties, sold as part of a bundle called RenderMan Pro Server, a RenderMan-compliant rendering software system developed by Pixar based on their own interface specification. Other examples include tools and plug-ins for programs such as the AUTODESK MAYA high-end 3D computer graphics software package from AutoDesk, Inc. of San Rafael, Calif.

One core functional aspect of PRMan can include the use of a "rendering engine" to convert geometric and/or mathematical descriptions of objects into images. This process is known in the industry as "rendering." For movies, other animated features, shorts, and special effects, a user (e.g., a skilled computer graphics artist) typically creates the geometric or mathematical description of objects, such as characters, props, background, or the like, that will used in the rendered image or animation sequence. In some instances, another user (e.g., a skilled articulator or rigger) typically creates a number of animation control variables (avars) for manipulating the objects. In further instances, yet another user (e.g., a skilled animator) typically uses the avars to pose the objects within the image or sequence and specify motions and positions of the objects over time to create an animation.

In some instances, objects may be too complex or the number of objects may be too numerous for a user to manipulate individual objects. As such, the production of CGI and computer-aided animation may involve the use of simulations and other dynamic techniques to specify motions and positions of the objects over time to create an animation. Programs such as MAYA provide a variety of types of pre-packaged simulators for different types of objects. However, the simulators are not based on common elements, and they are not inherently aware of dependencies, so the iterative process of refining and updating simulations can be both time-consuming and error-prone.

Accordingly, what is desired is to solve one or more of the problems relating to simulating animation for use in CGI and computer-aided animation, some of which may be discussed herein. Additionally, what is desired is to reduce some of the drawbacks relating to building, editing, and running simulators for use in CGI and computer-aided animation, some of which may be discussed herein.

BRIEF SUMMARY

The following portion of this disclosure presents a simplified summary of one or more innovations, embodiments, and/or examples found within this disclosure for at least the purpose of providing a basic understanding of the subject matter. This summary does not attempt to provide an extensive overview of any particular embodiment or example. Additionally, this summary is not intended to identify key/critical elements of an embodiment or example or to delineate the scope of the subject matter of this disclosure. Accordingly, one purpose of this summary may be to present some innovations, embodiments, and/or examples found within this disclosure in a simplified form as a prelude to a more detailed description presented later.

This disclosure relates to computer-generated imagery (CGI) and computer-aided animation. More specifically, this disclosure relates to a system and methods for building and editing simulators based on simulation primitives and techniques for implementing a simulator-independent application programming interface (API) for use in CGI and computer-aided animation.

In various embodiments, information defining a first set of simulation primitives and a second set of simulation primitives is received at one or more computer systems. A first simulator and a second simulator are provided, using one or more processors associated with the one or more computer systems. The first simulator is based on the first set of simulation primitives and produces a first simulation. The second simulator is based on the second set of simulation primitives and produces a second simulation. A data structure is generated, using the one or more processors associated with the one or more computer systems, wherein the data structure represents dependencies between the first simulation and the second simulation.

In various embodiments, the set of simulation primitives comprises one or more bodies. In some embodiments, the set of simulation primitives comprises one or more colliders. In some embodiments, the set of simulation primitives comprises one or more forces. In some embodiments, the set of simulation primitives comprises one or more unified primitives.

In various embodiments, the first simulation depends upon the second simulation in the case where the first simulation uses a body of the second simulation as a collider or as a force.

In various embodiments, the first simulation is executed before the second simulation, and the output of the first simulation is used as an input to the second simulation.

In various embodiments, information identifying a plurality of simulators is received at one or more computer systems. Information identifying a dependency data structure that represents dependencies between one or more simulators in the plurality of simulators is also received at the one or more computer systems. The plurality of simulators and the dependency data structure are retrieved from a non-transitory computer-readable medium. The plurality of simulators and the dependency data structure are then loaded into a memory. Function calls associated with at least one simulator in the plurality of simulators are received into the memory, wherein the function calls do not require specification of any simulator-specific information. Finally, the function calls are executed, using one or more processors associated with the one or more computer systems.

In various embodiments, executing the function calls comprises running a simulation, using the memory and the one or more processors associated with the one or more computer systems, wherein the simulation is comprised of the plurality of simulators.

In various embodiments, executing the function calls comprises ensuring, using the memory and the one or more processors associated with the one or more computer systems, a specified order in which the plurality of simulators is executed, such that the specified order complies with the dependency data structure.

In various embodiments, executing the function calls comprises executing, using the one or more processors associated with the one or more computer systems, the plurality of simulators in the specified order.

In various embodiments, executing the function calls comprises associating, using the memory and the one or more processors associated with the one or more computer systems, the results of the simulation with one or more animations.

In various embodiments, executing the function calls comprises generating simulation data, using the one or more processors associated with the one or more computer systems, while recording an animation.

In various embodiments, executing the function calls comprises re-computing, using the one or more processors associated with the one or more computer systems, dependencies in the dependency data structure.

Other embodiments of the invention are directed to systems and computer-readable media associated with methods described herein.

A further understanding of the nature of and equivalents to the subject matter of this disclosure (as wells as any inherent or express advantages and improvements provided) should be realized by reference to the remaining portions of this disclosure, any accompanying drawings, and the claims in addition to the above section.

BRIEF DESCRIPTION OF THE DRAWINGS

In order to reasonably describe and illustrate those innovations, embodiments, and/or examples found within this disclosure, reference may be made to one or more accompanying drawings. The additional details or examples used to describe the one or more accompanying drawings should not be considered as limitations to the scope of any of the claimed inventions, any of the presently described embodiments and/or examples, or the presently understood best mode of any innovations presented within this disclosure.

DETAILED DESCRIPTION OF EXEMPLARY EMBODIMENTS

This disclosure relates to computer-generated imagery (CGI) and computer-aided animation. More specifically, this disclosure relates to a system and methods for building and editing simulators based on simulation primitives and techniques for implementing a simulator-independent API for use in CGI and computer-aided animation. Simulations are described using primitives representing concepts from the simulation, and relationships representing how they interact. This canonical understanding allows us to create common authoring tools and workflows without knowing anything about the particular simulations.

A framework for simulating animation provides authoring, editing, and execution of different simulators by utilizing simulator-independent simulation primitives. The simulation primitives are used to encapsulate simulation specifics and a standard set of shared data and attributes that can be used to easily and quickly propagate changes to all simulators within a particular category. The simulation framework automates creation and enables preservation of relationships and dependencies between simulators throughout the animation design process. An API provides common procedural introspection on any simulation while making the specifics of the simulation transparent to the user. The framework includes applications for simulations based on the API; these applications provide a unified interface through which users can create, edit, and run different simulations such that any underlying implementation-level differences between the simulations are transparent to the user.

Simulations may be comprised of three elements: bodies, colliders, and forces. At a basic level, simulations affect bodies by using forces and colliders. The simulation framework also provides unified primitives (e.g., collision-groups, wind-fields, shapers) for concepts that are shared between multiple simulators, but implemented by each simulator separately. This allows users to reuse a single primitive across many different simulations, but doesn't force any particular implementation on any simulator.

DEFINITIONS

For the purposes of the instant application, a simulation comprises any computational process that requires time-integration over the shot, e.g., where the operation executed at time t is dependent on the operation executed at time t−1. A simulation may include, but is not limited to, a mass-spring, a complex fluid, cloth, hair, soft bodies (e.g., ropes, muscles, skin), rigid bodies, a rolling wheel, etc.

For the purposes of the instant application, a simulator comprises the software and/or hardware that runs a simulation.

Introduction

Figure 1:
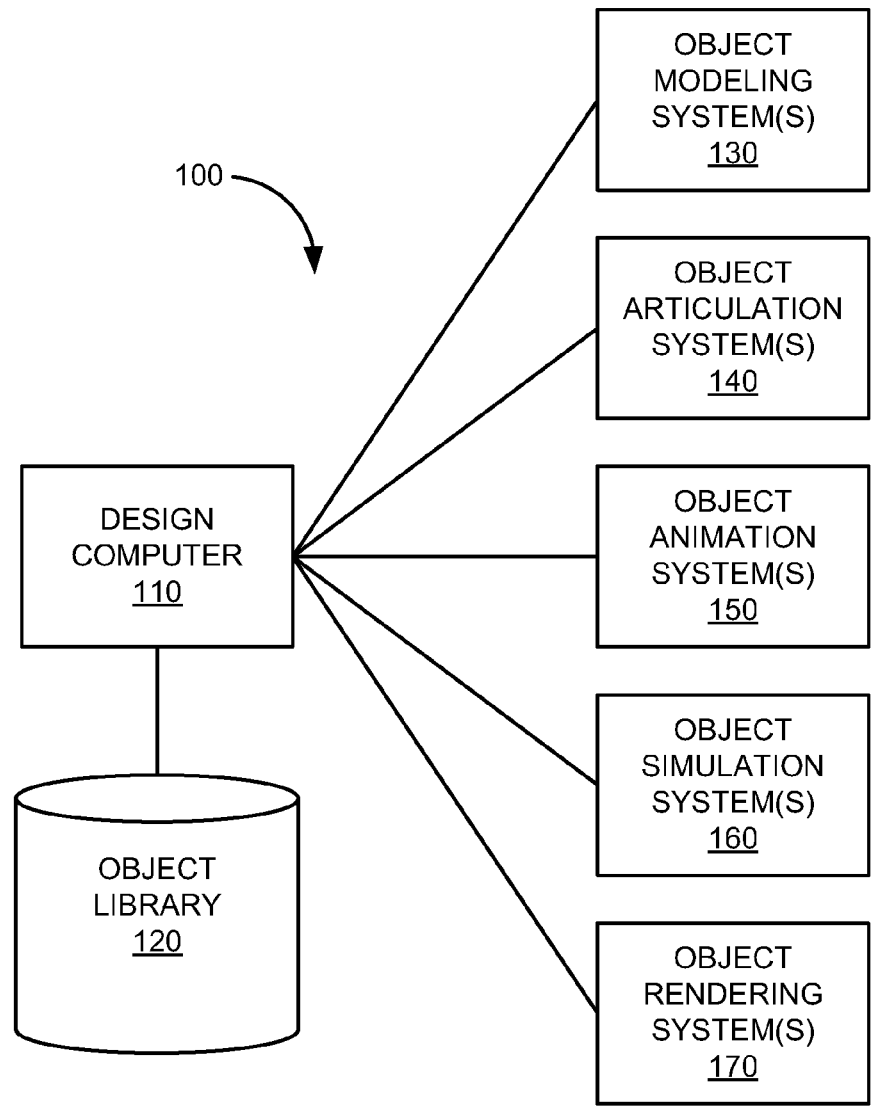
FIG. 1 is a simplified block diagram of a system for creating computer graphics imagery (CGI) and computer-aided animation that may implement or incorporate various embodiments or techniques disclosed herein.

FIG. 1 is a simplified block diagram of system 100 for creating computer graphics imagery (CGI) and computer-aided animation that may implement or incorporate various embodiments or techniques disclosed herein. FIG. 1 may merely be illustrative of an embodiment or implementation disclosed herein should not limit the scope of any invention as recited in the claims. One of ordinary skill in the art may recognize through this disclosure and the teachings presented herein other variations, generalities, modifications, and/or alternatives to those embodiments or implementations illustrated in FIG. 1. In this example, system 100 can include one or more design computers 110, one or more object libraries 120, one or more object modeler systems 130, one or more object articulation systems 140, one or more object animation systems 150, one or more object simulation systems 160, and one or more object rendering systems 170.

The one or more design computers 110 can include hardware and software elements configured for designing one or more computer-generated objects used in CGI and assisting with computer-aided animation. Each of the one or more design computers 110 may be embodied as a single computing device or a set of one or more computing devices. Some examples of computing devices are PCs, laptops, workstations, mainframes, cluster computing system, grid computing systems, cloud computing systems, embedded devices, computer graphics devices, gaming devices and consoles, consumer electronic devices having programmable processors, or the like. The one or more design computers 110 may be used at various stages of a production process (e.g., pre-production, designing, creating, editing, simulating, animating, rendering, post-production, etc.) to produce models of objects, computer-generated scenes, images, image sequences, animations, motion pictures, video, audio, or associated effects related to CGI and animation by employing one or more of object libraries 120 and/or systems 130-170 via various tools or interfaces.

The one or more object libraries 120 can include hardware and/or software elements configured for storing and accessing information related to one or more computer-generated objects. The information may be accessed by the one or more design computers 110 and/or systems 130-170 during various stages of a production process to produce CGI and animation. Some examples of the one or more object libraries 120 can include one or more file, one or more databases, or other storage devices and mechanisms. The one or more object libraries 120 may be locally accessible to the one or more design computers 110 and/or system 130-170 or hosted by one or more computer systems or storage devices externally accessible to the one or more design computers 110 and/or system 130-170.

Some examples of information stored in the one or more object libraries 120 can include information representing an object itself, metadata, object geometry, object topology, rigging, control data, animation data, animation cues, simulation data, texture data, lighting data, shader code, or the like. An object stored in the one or more object libraries 120 can include any entity that has an n-dimensional (e.g., 1D, 2D, or 3D) surface geometry. The shape of an object can include a set of points or locations in space (e.g., object space) that make up the object's surface. Topology of an object can include the connectivity of the surface of the object (e.g., the genus or number of holes in an object) or the vertex/edge/face connectivity of an object.

The one or more object modeling systems 130 can include hardware and/or software elements configured for modeling one or more computer-generated objects. The one or more object modeling systems 130 can be embodied as the one or more design computers 110 and/or software programs hosted by one or more computer systems. The one or more object modeling systems 130 may be invoked by or used directly by a user of the one or more design computers 110 and/or automatically invoked by or used by one or more processes associated with the one or more design computers 110. Some examples of software programs embodied as the one or more object modeling systems 130 can include commercially available high-end 3D computer graphics and 3D modeling software packages, such as 3D STUDIO MAX and AUTODESK MAYA produced by Autodesk, Inc. of San Rafael, Calif.

Modeling can include the creating, sculpting, and editing of an object. In various embodiments, the one or more object modeling systems 130 may be configured to generated a model to include a description of the shape of an object. The one or more object modeling systems 130 can be configured to facilitate the creation and/or editing of features, such as non-uniform rational B-splines or NURBS, polygons and subdivision surfaces (or SubDivs), that may be used to describe the shape of an object. In general, polygons are a widely used model medium due to their relative stability and functionality. Polygons can also act as the bridge between NURBS and SubDivs. NURBS are used mainly for their ready-smooth appearance and generally respond well to deformations. SubDivs are a combination of both NURBS and polygons representing a smooth surface via the specification of a coarser piecewise linear polygon mesh. A single object may have several different models that describe its shape.

The one or more object modeling systems 130 may further generate model data (e.g., 2D and 3D model data) for use by other elements of system 100 or that can be stored in the one or more object libraries 120. The one or more object modeling systems 130 may be configured to allow a user to associate additional information, metadata, color, lighting, rigging, controls, or the like, with all or a portion of the generated model data.

The one or more object articulation systems 140 can include hardware and/or software elements configured to articulating one or more computer-generated objects. The one or more object articulation systems 140 can be embodied as the one or more design computers 110 and/or software programs hosted by one or more computer systems. The one or more object articulation systems 140 may be invoked by or used directly by a user of the one or more design computers 110 and/or automatically invoked by or used by one or more processes associated with the one or more design computers 110. Some examples of software programs embodied as the one or more object articulation systems 140 can include commercially available high-end 3D computer graphics and 3D modeling software packages, such as 3D STUDIO MAX and AUTODESK MAYA produced by Autodesk, Inc. of San Rafael, Calif..

Articulation can include the building or creation of rigs, the rigging of an object, and the editing of rigging. In various embodiments, the one or more articulation systems 140 be configured to enable the specification of rigging for an object, such as for internal skeletal structures or eternal features, and to define how input motion deforms the object. One technique is called "skeletal animation," in which a character can be represented in at least two parts: a surface representation used to draw the character (called the skin) and a hierarchical set of bones used for animation (called the skeleton). Another technique involves the use of deformers in which a surface representation used to draw the character is deformed in response to one or more control structures that enclose the surface representation and whose manipulations drive the deformers.

The one or more object articulation systems 140 may further generate articulation data (e.g., data associated with controls or animations variables) for use by other elements of system 100 or that can be stored in the one or more object libraries 120. The one or more object articulation systems 140 may be configured to allow a user to associate additional information, metadata, color, lighting, rigging, controls, or the like, with all or a portion of the generated articulation data.

The one or more object animation systems 150 can include hardware and/or software elements configured for animating one or more computer-generated objects. The one or more object animation systems 150 can be embodied as the one or more design computers 110 and/or as software programs hosted by one or more computer systems. The one or more object animation systems 150 may be invoked by or used directly by a user of the one or more design computers 110 and/or automatically invoked by or used by one or more processes associated with the one or more design computers 110. Some examples of software programs embodied as the one or more object animation systems 150 can include commercially available high-end 3D computer graphics and 3D modeling software packages, such as 3D STUDIO MAX and AUTODESK MAYA produced by Autodesk, Inc. of San Rafael, Calif..

Animation can include the specification of motion and position of an object over time. In various embodiments, the one or more animation systems 150 may be configured to enable users to manipulate controls or animation variables or utilized character rigging to specify poses of object for one or more key frames of an animation sequence. The one or more animation systems 150 generate intermediary frames based on the one or more key frames. In some embodiments, the one or more animation systems 150 may be configured to enable users to specify animation cues, paths, or the like according to one or more predefined sequences. The one or more animation systems 150 generate frames of the animation based on the animation cues or paths. In further embodiments, the one or more animation systems 150 may be configured to enable users to define animations using one or more animation languages, morphs, deformations, or the like.

The one or more object animations systems 150 may further generate animation data (e.g., inputs associated with controls or animations variables) for use by other elements of system 100 or that can be stored in the one or more object libraries 120. The one or more object animations systems 150 may be configured to allow a user to associate additional information, metadata, color, lighting, rigging, controls, or the like, with all or a portion of the generated animation data.

The one or more object simulation systems 160 can include hardware and/or software elements configured for simulating one or more computer-generated objects. The one or more object simulation systems 160 can be embodied as the one or more design computers 110 and/or as software programs hosted by one or more computer systems. The one or more object simulation systems 160 may be invoked by or used directly by a user of the one or more design computers 110 and/or automatically invoked by or used by one or more processes associated with the one or more design computers 110. Some examples of software programs embodied as the one or more object simulation systems 160 can include physically-based numerical engines and commercially available high-end 3D computer graphics and 3D modeling software packages, such as 3D STUDIO MAX and AUTODESK MAYA produced by Autodesk, Inc. of San Rafael, Calif..

Simulation can include determining behavior, such as motion/position/collisions, of an object in response to one or more simulated forces, conditions, or other objects. In various embodiments, the one or more object simulation systems 160 may be configured to enable users to create, define, edit, or configure simulation engines, such as a physics engine or physics processing unit (PPU/GPGPU) using one or more physically-based numerical techniques. In general, a physics engine can include a computer program that simulates one or more physics models (e.g., a Newtonian physics model), using variables such as mass, velocity, friction, wind resistance, or the like. The physics engine may simulate and predict effects under different conditions that would approximate what happens to an object according to the physics model. The one or more object simulation systems 160 may be used to simulate the behavior of objects, such as hair, fur, and cloth, in response to a physics model and/or animation of one or more characters and objects within a computer-generated scene.

The one or more object simulation systems 160 may further generate simulation data (e.g., motion and position of an object over time) for use by other elements of system 100 or that can be stored in the one or more object libraries 120. The generated simulation data may be combined with or used in addition to data generated by the systems 130-150.

The one or more object rendering systems 170 can include hardware and/or software element configured for "rendering" or generating one or more images of one or more computer-generated objects. The one or more object rendering systems 170 can be embodied as the one or more design computers 110 and/or software programs hosted by one or more computer systems. The one or more object rendering systems 170 may be invoked by or used directly by a user of the one or more design computers 110 and/or automatically invoked by or used by one or more processes associated with the one or more design computers 110. One example of a software program embodied as the one or more object rendering systems 170 can include PhotoRealistic RenderMan, or PRMan, produced by Pixar Animations Studios of Emeryville, Calif..

"Rendering" can include generating an image from a model based on information such as geometry, viewpoint, texture, lighting, and shading information. In various embodiments, the one or more object rendering systems 170 can be configured to render one or more objects to produce one or more computer-generated images or a set of images over time that provide an animation. The one or more object rendering systems 170 may generate digital images or raster graphics images.

In various embodiments, a rendered image can be understood in terms of a number of visible features. Some examples of visible features that may be considered by the one or more object rendering systems 170 may include shading (e.g., techniques relating to how the color and brightness of a surface varies with lighting), texture-mapping (e.g., techniques relating to applying detail information to surfaces or objects using maps), bump-mapping (e.g., techniques relating to simulating small-scale bumpiness on surfaces), fogging/participating medium (e.g., techniques relating to how light dims when passing through non-clear atmosphere or air; shadows (e.g., techniques relating to effects of obstructing light), soft shadows (e.g., techniques relating to varying darkness caused by partially obscured light sources), reflection (e.g., techniques relating to mirror-like or highly glossy reflection), transparency or opacity (e.g., techniques relating to sharp transmissions of light through solid objects), translucency (e.g., techniques relating to highly scattered transmissions of light through solid objects), refraction (e.g., techniques relating to bending of light associated with transparency, diffraction (e.g., techniques relating to bending, spreading and interference of light passing by an object or aperture that disrupts the ray), indirect illumination (e.g., techniques relating to surfaces illuminated by light reflected off other surfaces, rather than directly from a light source, also known as global illumination), caustics (e.g., a form of indirect illumination with techniques relating to reflections of light off a shiny object, or focusing of light through a transparent object, to produce bright highlights on another object), depth of field (e.g., techniques relating to how objects appear blurry or out of focus when too far in front of or behind the object in focus), motion blur (e.g., techniques relating to how objects appear blurry due to high-speed motion, or the motion of the camera), non-photorealistic rendering (e.g., techniques relating to rendering of scenes in an artistic style, intended to look like a painting or drawing), or the like.

The one or more object rendering systems 170 may further render images (e.g., motion and position of an object over time) for use by other elements of system 100 or that can be stored in the one or more object libraries 120. The one or more object rendering systems 170 may be configured to allow a user to associate additional information or metadata with all or a portion of the rendered image. The one or more object rendering systems 170 may output information that can be encoded in various image and video formats, such as those related to JPG, PNG, MPG, MOV, H.264, or the like.

In various embodiments, system 100 may include one or more hardware elements and/or software elements, components, tools, or processes, embodied as the one or more design computers 110, object library 120, the one or more object modeler systems 130, the one or more object articulation systems 140, the one or more object animation systems 150, the one or more object simulation systems 160, and/or the one or more object rendering systems 170 that provide one or more tools for a simulation system. In some aspects, a 3D model may be the sole authored data from which system 100 automatically creates and maintains other versions or representation of the 3D model suitable for a variety of specific tasks or task related tools, such as animation, simulation, and rendering. In further aspects, system 100 may automatically generate and maintain dependencies (i.e., dependency graph) between a plurality of simulators.

Simulation System

Figure 2:
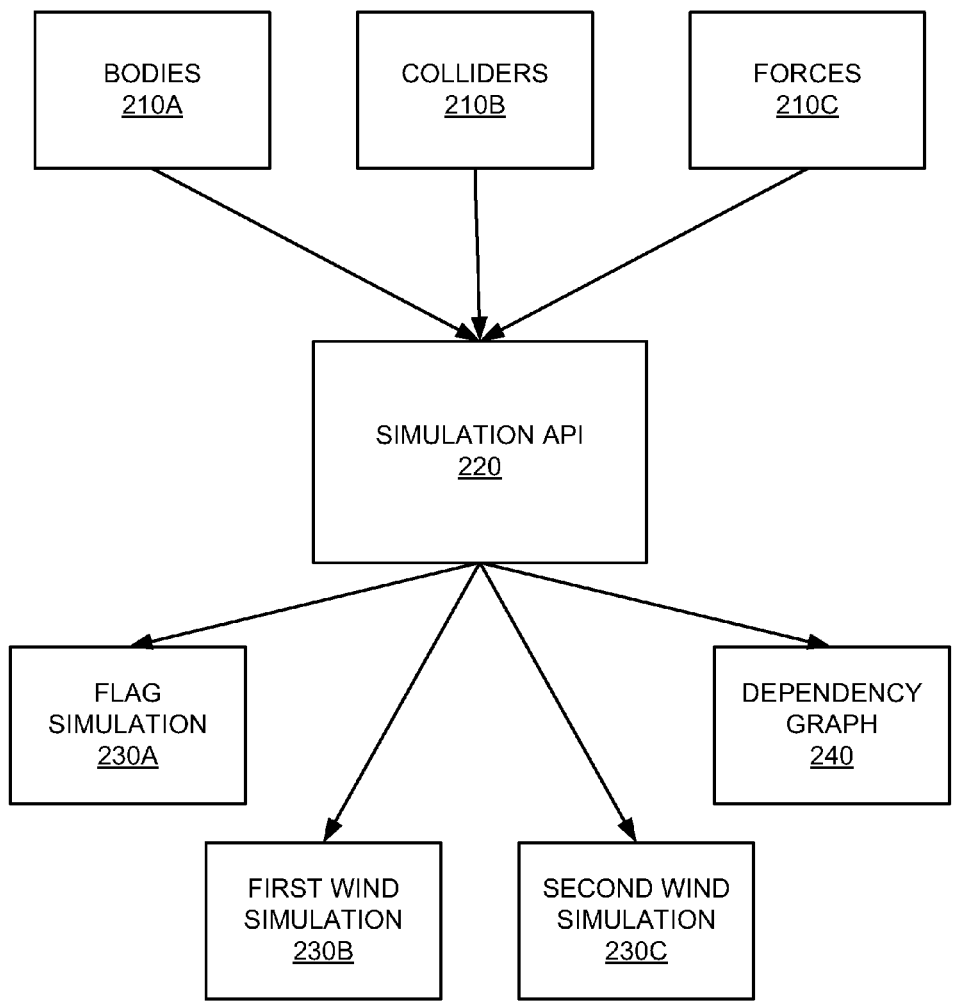
FIG. 2 is a simplified block diagram of a system for simulating animation in one embodiment for use in CGI and computer-aided animation.

FIG. 2 is a simplified block diagram of a simulation system 200 in one embodiment for use in CGI and computer-aided animation. Simulation system 200 may be implemented by or otherwise incorporate elements of system 100 of FIG. 1. In various embodiments, simulation system 200 allows an animator to create, build, and edit one or more simulations based on one or more simulation primitives and/or unified primitives. One or more simulations are created from selected simulation primitives comprising one or more of bodies 210A, colliders 210B, and forces 210C. In one embodiment, simulation-independent API 220 provides functions for creating a flag simulation 230A, a first wind simulation 230B, a second wind simulation 230C, and dependency graph 240.

Because each simulation 230 is based on the same simulation primitives, one can update a single simulation primitive and thereby instantly update all simulations incorporating the updated simulation primitive. For example, in one embodiment, a simulation primitive incorporated into both the first wind simulation 230B (originating from a NE direction) and the second wind simulation 230C (originating from a NNE direction) is updated to increase the force of the wind from 10 miles per hour to 60 miles per hour. The single update to the underlying simulation primitive automatically propagates the update to both the first wind simulation 230B and the second wind simulation 230C.

Dependency graph 240 encapsulates dependencies between one or more simulations in a scene. For example, in one embodiment, flag simulation 230A comprises a first set of bodies and a second set of colliders. When the force of the wind is increased from 10 miles per hour to 60 miles per hour, dependency graph 240 ensures that all simulations interact accordingly and appropriately, thereby eliminating potential user error due to forgetting to update some simulations when updating others.

Simulation-independent API 220 allows common procedural introspection on any simulation without knowledge of what the simulation actually does. In particular, one can compute dependencies between any number of simulations, of any type. This is useful for running a large number of simulations on a server farm. Simulation-independent API 220 also provides applications and editors to run the simulations in a variety of contexts: as part of a recording or in-session or offline; on a server farm or locally on a machine. This API abstracts many simulator issues that normally dominate the way a simulator is integrated into the pipeline (e.g., does the simulation run as a separate process, or in the running session? Does the simulation generate avar values, or some binary data that is read in separately? Does the simulation require multi-threading?).

Figure 3:
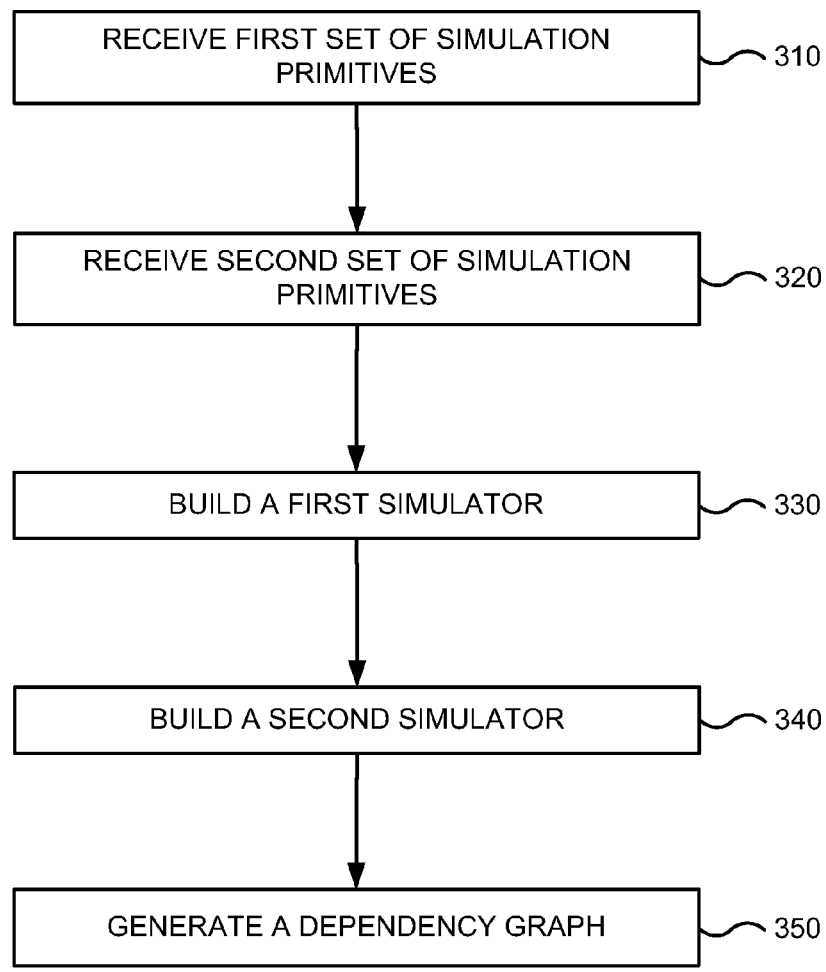
FIG. 3 is a flowchart of a method for creating a set of inter-dependent simulators based on primitives in one embodiment.

FIG. 3 is a flowchart of a method for creating a set of inter-dependent simulators based on primitives in one embodiment. A first set of simulation primitives is received (310)—this first set may comprise one or more of bodies, colliders, forces, and/or unified primitives. A second set of simulation primitives is also received (320)—this second set also may comprise one or more of bodies, colliders, forces, and/or unified primitives. A first simulator is built using the first set of simulation primitives (330)—this first simulator executes a first simulation, e.g., a flag simulation. A second simulator is built using the second set of simulation primitives (340)—this second simulator executes a second simulation, e.g., a wind simulation. In addition, a dependency graph is generated (350) that represents dependencies between the first simulation and the second simulation. This dependency graph is used to enforce compliance with respect to dependencies between simulations as one or more simulations are modified. For example, when the direction and/or speed of the wind is changed in the wind simulation, the simulation system 200 will check the dependency graph and automatically update the flag simulator to comply with the changes in the wind simulator. The dependency graph can also be re-computed as required.

The results of a simulation can be incorporated back into the animation. For instance, the point-positions output by a cloth simulation may be used to deform the cloth garment. Or, the volumetric data output by a fluid simulation may be used to construct a surface mesh representing the boundary of the fluid. In the same manner, the results from one simulation may be used as the input for another dependent simulation. For instance, a hair simulation may use the output of a cloth simulation to collide against.

Simulation data can also be generated while recording an animation. In this case, simulations may run in parallel with the animation software while the animation software displays or records the animation. When recording the animation, the animation software may wait until the simulation finishes a frame before recording that frame of animation.

Figure 4:
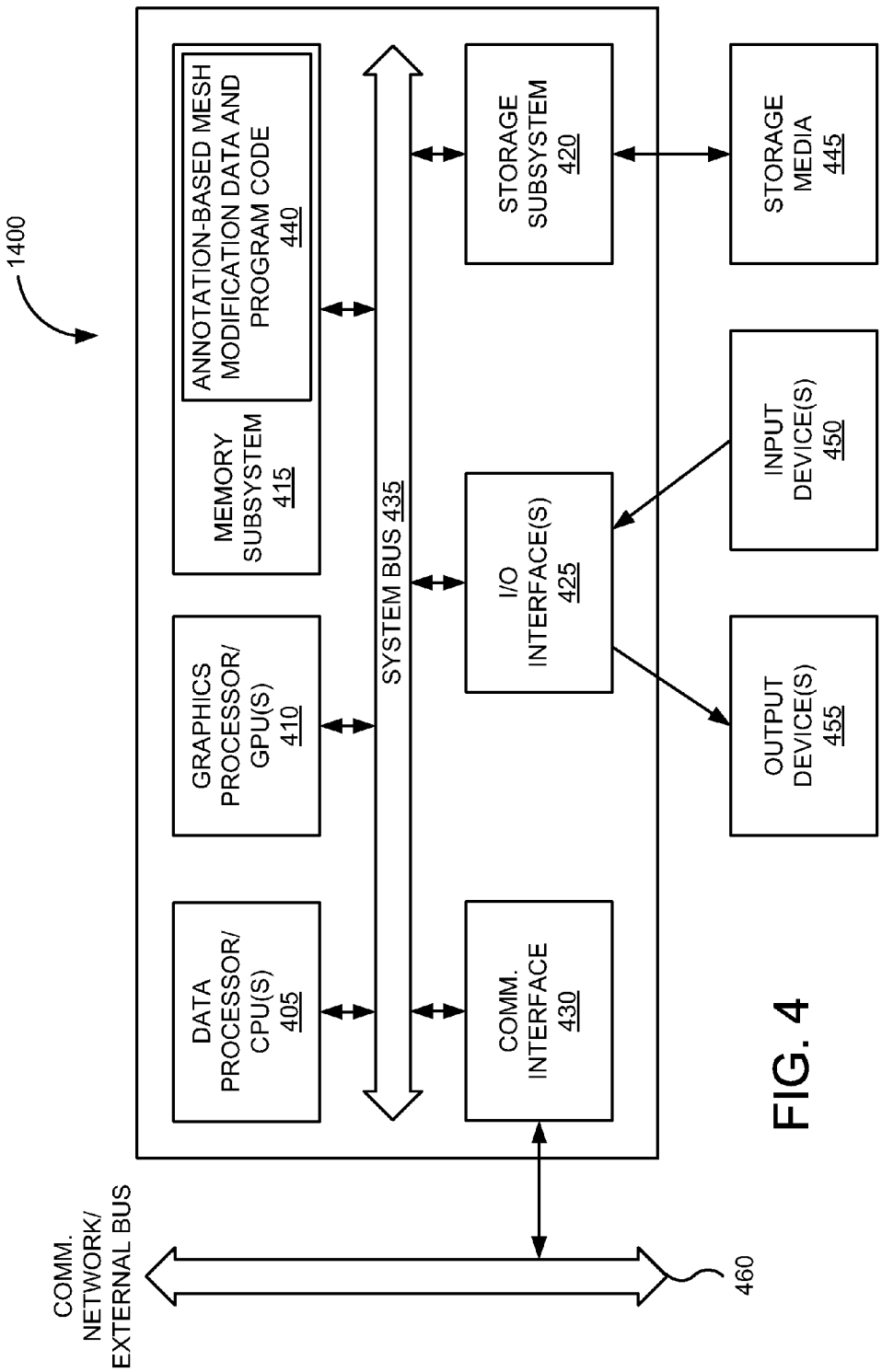
FIG. 4 is a block diagram of a computer system that may be used to implement or practice various embodiments of an invention whose teachings may be presented herein.

FIG. 4 is a block diagram of computer system 400 that may be used to implement or practice various embodiments of an invention whose teachings may be presented herein. Computer system 400 can include hardware and/or software elements configured for performing logic operations and calculations, input/output operations, machine communications, or the like. Computer system 400 may include familiar computer components, such as one or more one or more data processors or central processing units (CPUs) 405, one or more graphics processors or graphical processing units (GPUs) 410, memory subsystem 415, storage subsystem 420, one or more input/output (I/O) interfaces 425, communications interface 430, or the like. Computer system 400 can include system bus 435 interconnecting the above components and providing functionality, such connectivity and inter-device communication. Computer system 400 may be embodied as a computing device, such as a personal computer (PC), a workstation, a mini-computer, a mainframe, a cluster or farm of computing devices, a laptop, a notebook, a netbook, a PDA, a smartphone, a consumer electronic device, a gaming console, or the like.

The one or more data processors or central processing units (CPUs) 405 can include hardware and/or software elements configured for executing logic or program code or for providing application-specific functionality. Some examples of CPU(s) 405 can include one or more microprocessors (e.g., single core and multi-core) or micro-controllers, such as PENTIUM, ITANIUM, or CORE 2 processors from Intel of Santa Clara, Calif. and ATHLON, ATHLON XP, and OPTERON processors from Advanced Micro Devices of Sunnyvale, Calif.. CPU(s) 405 may also include one or more field-gate programmable arrays (FPGAs), application-specific integrated circuits (ASICs), or other microcontrollers. The one or more data processors or central processing units (CPUs) 405 may include any number of registers, logic units, arithmetic units, caches, memory interfaces, or the like. The one or more data processors or central processing units (CPUs) 405 may further be integrated, irremovably or moveably, into one or more motherboards or daughter boards.

The one or more graphics processor or graphical processing units (GPUs) 410 can include hardware and/or software elements configured for executing logic or program code associated with graphics or for providing graphics-specific functionality. GPUs 410 may include any conventional graphics processing unit, such as those provided by conventional video cards. Some examples of GPUs are commercially available from NVIDIA, ATI, and other vendors. In various embodiments, GPUs 410 may include one or more vector or parallel processing units. These GPUs may be user programmable, and include hardware elements for encoding/decoding specific types of data (e.g., video data) or for accelerating 2D or 3D drawing operations, texturing operations, shading operations, or the like. The one or more graphics processors or graphical processing units (GPUs) 410 may include any number of registers, logic units, arithmetic units, caches, memory interfaces, or the like. The one or more data processors or central processing units (CPUs) 405 may further be integrated, irremovably or moveably, into one or more motherboards or daughter boards that include dedicated video memories, frame buffers, or the like.

Memory subsystem 415 can include hardware and/or software elements configured for storing information. Memory subsystem 415 may store information using machine-readable articles, information storage devices, or computer-readable storage media. Some examples of these articles used by memory subsystem 470 can include random access memories (RAM), read-only-memories (ROMS), volatile memories, non-volatile memories, and other semiconductor memories. In various embodiments, memory subsystem 415 can include annotation-based mesh modification data and program code 440.

Storage subsystem 420 can include hardware and/or software elements configured for storing information. Storage subsystem 420 may store information using machine-readable articles, information storage devices, or computer-readable storage media. Storage subsystem 420 may store information using storage media 445. Some examples of storage media 445 used by storage subsystem 420 can include floppy disks, hard disks, optical storage media such as CD-ROMS, DVDs and bar codes, removable storage devices, networked storage devices, or the like. In some embodiments, all or part of annotation-based mesh modification data and program code 440 may be stored using storage subsystem 420.

In various embodiments, computer system 400 may include one or more hypervisors or operating systems, such as WINDOWS, WINDOWS NT, WINDOWS XP, VISTA, or the like from Microsoft or Redmond, Wash., SOLARIS from Sun Microsystems, LINUX, UNIX, and UNIX-based operating system. Computer system 400 may also include one or more applications configured to executed, perform, or otherwise implement techniques disclosed herein. These applications may be embodied as annotation-based mesh modification data and program code 440. Additionally, computer programs, executable computer code, human-readable source code, shader code, rendering engines, or the like, and data, such as image files, models including geometrical descriptions of objects, ordered geometric descriptions of objects, procedural descriptions of models, scene descriptor files, or the like, may be stored in memory subsystem 415 and/or storage subsystem 420.

The one or more input/output (I/O) interfaces 425 can include hardware and/or software elements configured for performing I/O operations. One or more input devices 450 and/or one or more output devices 455 may be communicatively coupled to the one or more I/O interfaces 425.

The one or more input devices 450 can include hardware and/or software elements configured for receiving information from one or more sources for computer system 400. Some examples of the one or more input devices 450 may include a computer mouse, a trackball, a track pad, a joystick, a wireless remote, a drawing tablet, a voice command system, an eye tracking system, external storage systems, a monitor appropriately configured as a touch screen, a communications interface appropriately configured as a transceiver, or the like. In various embodiments, the one or more input devices 450 may allow a user of computer system 400 to interact with one or more non-graphical or graphical user interfaces to enter a comment, select objects, icons, text, user interface widgets, or other user interface elements that appear on a monitor/display device via a command, a click of a button, or the like.

The one or more output devices 455 can include hardware and/or software elements configured for outputting information to one or more destinations for computer system 400. Some examples of the one or more output devices 455 can include a printer, a fax, a feedback device for a mouse or joystick, external storage systems, a monitor or other display device, a communications interface appropriately configured as a transceiver, or the like. The one or more output devices 455 may allow a user of computer system 400 to view objects, icons, text, user interface widgets, or other user interface elements.

A display device or monitor may be used with computer system 400 and can include hardware and/or software elements configured for displaying information. Some examples include familiar display devices, such as a television monitor, a cathode ray tube (CRT), a liquid crystal display (LCD), or the like.

Communications interface 430 can include hardware and/or software elements configured for performing communications operations, including sending and receiving data. Some examples of communications interface 430 may include a network communications interface, an external bus interface, an Ethernet card, a modem (telephone, satellite, cable, ISDN), (asynchronous) digital subscriber line (DSL) unit, FireWire interface, USB interface, or the like. For example, communications interface 430 may be coupled to communications network/external bus 480, such as a computer network, to a FireWire bus, a USB hub, or the like. In other embodiments, communications interface 430 may be physically integrated as hardware on a motherboard or daughter board of computer system 400, may be implemented as a software program, or the like, or may be implemented as a combination thereof.

In various embodiments, computer system 400 may include software that enables communications over a network, such as a local area network or the Internet, using one or more communications protocols, such as the HTTP, TCP/IP, RTP/RTSP protocols, or the like. In some embodiments, other communications software and/or transfer protocols may also be used, for example IPX, UDP or the like, for communicating with hosts over the network or with a device directly connected to computer system 400.

As suggested, FIG. 4 is merely representative of a general-purpose computer system appropriately configured or specific data processing device capable of implementing or incorporating various embodiments of an invention presented within this disclosure. Many other hardware and/or software configurations may be apparent to the skilled artisan which are suitable for use in implementing an invention presented within this disclosure or with various embodiments of an invention presented within this disclosure. For example, a computer system or data processing device may include desktop, portable, rack-mounted, or tablet configurations. Additionally, a computer system or information processing device may include a series of networked computers or clusters/grids of parallel processing devices. In still other embodiments, a computer system or information processing device may techniques described above as implemented upon a chip or an auxiliary processing board.

Various embodiments of any of one or more inventions whose teachings may be presented within this disclosure can be implemented in the form of logic in software, firmware, hardware, or a combination thereof. The logic may be stored in or on a machine-accessible memory, a machine-readable article, a tangible computer-readable medium, a computer-readable storage medium, or other computer/machine-readable media as a set of instructions adapted to direct a central processing unit (CPU or processor) of a logic machine to perform a set of steps that may be disclosed in various embodiments of an invention presented within this disclosure. The logic may form part of a software program or computer program product as code modules become operational with a processor of a computer system or an information-processing device when executed to perform a method or process in various embodiments of an invention presented within this disclosure. Based on this disclosure and the teachings provided herein, a person of ordinary skill in the art will appreciate other ways, variations, modifications, alternatives, and/or methods for implementing in software, firmware, hardware, or combinations thereof any of the disclosed operations or functionalities of various embodiments of one or more of the presented inventions.

The disclosed examples, implementations, and various embodiments of any one of those inventions whose teachings may be presented within this disclosure are merely illustrative to convey with reasonable clarity to those skilled in the art the teachings of this disclosure. As these implementations and embodiments may be described with reference to exemplary illustrations or specific figures, various modifications or adaptations of the methods and/or specific structures described can become apparent to those skilled in the art. All such modifications, adaptations, or variations that rely upon this disclosure and these teachings found herein, and through which the teachings have advanced the art, are to be considered within the scope of the one or more inventions whose teachings may be presented within this disclosure. Hence, the present descriptions and drawings should not be considered in a limiting sense, as it is understood that an invention presented within a disclosure is in no way limited to those embodiments specifically illustrated.

Accordingly, the above description and any accompanying drawings, illustrations, and figures are intended to be illustrative but not restrictive. The scope of any invention presented within this disclosure should, therefore, be determined not with simple reference to the above description and those embodiments shown in the figures, but instead should be determined with reference to the pending claims along with their full scope or equivalents.

What is claimed is:

1. A computer-implemented method for simulating animation, the method comprising:
    receiving, at one or more computer systems, information defining a first set of simulation primitives and a second set of simulation primitives;
    providing, using one or more processors associated with the one or more computer systems, a first simulator based on the first set of simulation primitives, wherein the first simulator produces a first simulation, and a second simulator based on the second set of simulation primitives, wherein the second simulator produces a second simulation; and
    generating, using the one or more processors associated with the one or more computer systems, a dependency graph that represents dependencies between the first simulation and the second simulation, wherein the dependency graph includes information usable for determining that an output of the first simulation is an input to the second simulation;
    updating, using the one or more processors associated with the one or more computer systems, a simulation primitive in the first set of simulation primitives;
    determining, using the one or more processors associated with the one or more computer systems, that the second simulation depends on the first simulation based on the dependency graph; and
    updating, using the one or more processors associated with the one or more computer systems, the second simulator to comply with a change in the output from the first simulation.

2. The computer-implemented method of claim 1 wherein the set of simulation primitives comprises one or more bodies.

3. The computer-implemented method of claim 1 wherein the set of simulation primitives comprises one or more colliders.

4. The computer-implemented method of claim 1 wherein the set of simulation primitives comprises one or more forces.

5. The computer-implemented method of claim 1 wherein the set of simulation primitives comprises one or more unified primitives.

6. The computer-implemented method of claim 1, wherein the second simulation depends upon the first simulation in the case where the second simulation uses a body of the first simulation as a collider or as a force.

7. The computer-implemented method of claim 6, the method further comprising ensuring that the first simulation is executed before the second simulation, wherein the output of the first simulation is used as an input to the second simulation.

8. The method of claim 1, wherein each of the first simulation and the second simulation comprises a computational process that requires time-integration.

9. The method of claim 1, wherein the first simulator and the second simulator comprise software and/or hardware.

10. The method of claim 1, wherein the first simulator and the second simulator are different.

11. A computer-implemented method for controlling simulators, the method comprising:
receiving, at one or more computer systems, information identifying a first simulator and a second simulator;
receiving, at the one or more computer systems, information identifying a dependency graph that represents dependencies between a first simulation associated with the first simulator and a second simulation associated with the second simulator, wherein the dependency graph includes information usable for determining that an output of the first simulation is an input to the second simulation;
retrieving the first simulator, the second simulator, and the dependency graph from a non-transitory computer-readable medium;
loading into a memory the first simulator, the second simulator, and the dependency graph;
receiving, into the memory, function calls associated with the first simulator and the second simulator, wherein the function calls do not require specification of any simulator-specific information;
determining, using one or more processors associated with the one or more computer systems, that the second simulation depends on the first simulation based on the dependency graph; and
executing, using one or more processors associated with the one or more computer systems, the function calls, wherein executing the function calls comprises running the first simulation and the second simulation in an order that is specified by the dependency graph.

12. The method of claim 11, wherein executing the function calls comprises associating, using the memory and the one or more processors associated with the one or more computer systems, the results of the simulation with one or more animations.

13. The method of claim 11, wherein executing the function calls comprises generating simulation data, using the one or more processors associated with the one or more computer systems, while recording an animation.

14. The method of claim 11, wherein executing the function calls comprises re-computing, using the one or more processors associated with the one or more computer systems, dependencies in the dependency graph.

15. A non-transitory computer-readable medium storing computer-executable program code for simulating animation using a simulator-independent API, the computer-readable medium comprising:
program code for receiving, at one or more computer systems, information identifying a first simulator and a second simulator;
program code for receiving, at the one or more computer systems, information identifying a dependency graph that represents dependencies between a first simulation associated with the first simulator and a second simulation associated with the second simulator, wherein the dependency graph includes information usable for determining that an output of the first simulation is an input to the second simulation;
program code for retrieving the first simulator, the second simulator, and the dependency graph from a non-transitory computer-readable medium;
program code for loading into a memory the first simulator, the second simulator, and the dependency graph;
program code for receiving, into the memory, function calls associated with the first simulator and the second simulator, wherein the function calls do not require specification of any simulator-specific information;
program code for determining, using one or more processors associated with the one or more computer systems, that the second simulation depends on the first simulation based on the dependency graph; and
program code for executing, using one or more processors associated with the one or more computer systems, the function calls, wherein executing the function calls comprises running the first simulation and the second simulation in an order that is specified by the dependency graph.

16. The non-transitory computer-readable medium of claim 15, wherein executing the function calls comprises associating, using the memory and the one or more processors associated with the one or more computer systems, the results of the simulation with one or more animations.

17. The non-transitory computer-readable medium of claim 15, wherein executing the function calls comprises generating simulation data, using the one or more processors associated with the one or more computer systems, while recording an animation.

18. The non-transitory computer-readable medium of claim 15, wherein executing the function calls comprises re-computing, using the one or more processors associated with the one or more computer systems, dependencies in the dependency graph.

19. A system for simulating animation, the system comprising:
a processor; and
a memory configured to store a set of instructions to be executed by the processor, the set of instructions comprising:
receiving information defining a first set of simulation primitives and a second set of simulation primitives;
providing a first simulator based on the first set of simulation primitives and a second simulator based on the second set of simulation primitives; and
generating a dependency graph that represents dependencies between the first simulator and the second simulator, wherein the dependency graph includes information usable for determining that an output of the first simulation is an input to the second simulation;
updating a simulation primitive in the first set of simulation primitives;
determining that the second simulation depends on the first simulation based on the dependency graph; and updating the second simulator to comply with a change in the output from the first simulation.

20. The system of claim 19, wherein the set of simulation primitives comprises one or more of the group consisting of bodies, colliders, forces, and unified primitives.

21. The system of claim 19, wherein the second simulator depends upon the first simulator in the case where the second simulator incorporates a body of the first simulator as a collider or as a force.

22. The system of claim 21, wherein the memory is configured to store further instructions comprising ensuring that the first simulator is executed before the second simulator, wherein the output of the first simulator is used as an input to the second simulator.

* * * * *